United States Patent
Schork et al.

(10) Patent No.: US 11,431,164 B2
(45) Date of Patent: Aug. 30, 2022

(54) CIRCUIT ARRANGEMENT FOR COMBINED PROTECTION OF A LOAD FROM TEMPORARY AND TRANSIENT OVERVOLTAGES

(71) Applicant: DEHN SE + CO KG, Neumarkt/Opf. (DE)

(72) Inventors: Franz Schork, Nuremberg (DE); Ralph Brocke, Ilmenau/Oberpörlitz (DE)

(73) Assignee: DEHN SE, Neumarkt i.d.OPf. (DE)

( * ) Notice: Subject to any disclaimer, the term of this patent is extended or adjusted under 35 U.S.C. 154(b) by 330 days.

(21) Appl. No.: 16/761,389

(22) PCT Filed: Oct. 17, 2018

(86) PCT No.: PCT/EP2018/078416
§ 371 (c)(1),
(2) Date: May 4, 2020

(87) PCT Pub. No.: WO2019/086249
PCT Pub. Date: May 9, 2019

(65) Prior Publication Data
US 2020/0366089 A1 Nov. 19, 2020

(30) Foreign Application Priority Data

Nov. 6, 2017 (DE) ...................... 10 2017 125 894.9
Feb. 9, 2018 (DE) ...................... 10 2018 103 012.6

(51) Int. Cl.
*H02H 9/04* (2006.01)
*G01R 19/145* (2006.01)
(Continued)

(52) U.S. Cl.
CPC ........... *H02H 9/042* (2013.01); *G01R 19/145* (2013.01); *G01R 19/175* (2013.01); *H01C 7/10* (2013.01);
(Continued)

(58) Field of Classification Search
CPC .......... H02H 9/042; H02H 3/025; H02H 3/08; H02H 3/205; H02H 3/02; H02H 9/04;
(Continued)

(56) References Cited

U.S. PATENT DOCUMENTS

| 6,226,166 B1 | 5/2001 | Gumley et al. ............... 361/118 |
| 6,392,859 B1 | 5/2002 | Ohshima ....................... 361/100 |

(Continued)

FOREIGN PATENT DOCUMENTS

| CN | 102386606 A | 3/2012 | ............. H02H 3/08 |
| CN | 105490245 A | 4/2016 | ............. H02H 3/087 |

(Continued)

OTHER PUBLICATIONS

CN-111293005; Askan K, Circuit Breaker; Feb. 18, 2022; Entire specification with Figures (Year: 2022).*
(Continued)

*Primary Examiner* — Dharti H Patel
(74) *Attorney, Agent, or Firm* — Bodner & O'Rourke, LLP; Gerald T. Bodner; Christian P. Bodner

(57) ABSTRACT

The invention relates to a circuit arrangement for combined protection of a load from temporary and transient overvoltages with emergency operation of the load in the presence of a temporary overvoltage and with integrated follow current limitation, wherein a first surge arrester, in particular a spark gap or a varistor, is provided between network-side input terminals and a second surge arrester, in particular a varistor, is provided between load-side output terminals for follow current limitation. According to the invention, at least one controlled semiconductor switch is provided in each case in the series branch between the input terminal and the output terminal and in the output-side parallel branch, wherein a mechanical switch and a series capacitance are connected in parallel with the semiconductor switch in the series branch.

(Continued)

Furthermore, the semiconductor switch in the parallel branch is part of a series circuit comprising a parallel circuit comprising a second surge arrester and a parallel capacitance. A series inductance is provided in the series branch between the input terminal and the parallel circuit comprising the series capacitance, the controlled semiconductor switch and the mechanical switch. A microcontroller for controlling the semiconductor switches is also present, wherein the microcontroller is connected to a current detector in the series branch.

8 Claims, 1 Drawing Sheet

(51) Int. Cl.
    *G01R 19/175*     (2006.01)
    *H01C 7/10*     (2006.01)
    *H01F 19/08*     (2006.01)
    *H02H 3/02*     (2006.01)
    *H02H 3/08*     (2006.01)
    *H02H 3/20*     (2006.01)
    *H03K 17/08*     (2006.01)

(52) U.S. Cl.
    CPC ............. *H01F 19/08* (2013.01); *H02H 3/025* (2013.01); *H02H 3/08* (2013.01); *H02H 3/205* (2013.01); *H03K 17/08* (2013.01)

(58) Field of Classification Search
    CPC ...... H02H 3/20; G01R 19/145; G01R 19/175; H01C 7/10; H01F 19/08; H03K 17/08
    USPC .......................................................... 361/33
    See application file for complete search history.

(56) References Cited

U.S. PATENT DOCUMENTS

2012/0050933 A1    3/2012  Xu et al. ...................... 361/100
2017/0155244 A1    6/2017  Dickey et al.

FOREIGN PATENT DOCUMENTS

| | | | |
|---|---|---|---|
| CN | 105529677 A | 4/2016 | ............. H02H 3/093 |
| CN | 105609344 A | 5/2016 | ............... H01H 9/54 |
| DE | 102004036164 A1 | 3/2006 | ............... H02H 3/20 |
| WO | WO2011070235 A1 | 6/2011 | ............... H02H 3/06 |

OTHER PUBLICATIONS

WO-2011-070235; Electronic protection circuit and protection device; Jun. 16, 2011; Entire speficiation with Figures (Year: 2011).*

Office Action (in German), dated Oct. 11, 2018, issued by the German Patent Office for Applicant's corresponding German Patent Application No. DE102018103012.6, filed Feb. 9, 2018.

Notification Concerning Transmittal of International Preliminary Report on Patentability (Chapter I of the Patent Cooperation Treaty), in English, dated May 22, 2020, which was issued by the International Bureau of WIPO in Applicant's corresponding international PCT application having Serial No. PCT/EP2018/078416, filed on Oct. 17, 2018.

English translation of the International Preliminary Report on Patentability (Chapter I of the Patent Cooperation Treaty), dated May 12, 2020, which was issued by the International Bureau of WIPO in Applicant's corresponding international PCT application having Serial No. PCT/EP2018/078416, filed on Oct. 17, 2018.

Written Opinion of the International Searching Authority, in English, dated Jan. 28, 2019, which was issued by the International Bureau of WIPO in Applicant's corresponding international PCT application having Serial No. PCT/EP2018/078416, filed on Oct. 17, 2018.

International Search Report, in English, dated Jan. 28, 2019, which was issued by the International Bureau of WIPO in Applicant's corresponding international PCT application having Serial No. PCT/EP2018/078416, filed on Oct. 17, 2018.

* cited by examiner

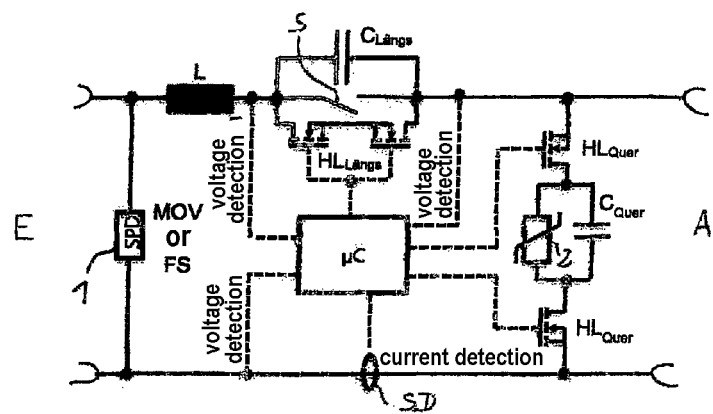

CIRCUIT ARRANGEMENT FOR COMBINED PROTECTION OF A LOAD FROM TEMPORARY AND TRANSIENT OVERVOLTAGES

The invention is based on a circuit arrangement for combined protection of a load from temporary and transient overvoltages with emergency operation of the load in the presence of a temporary overvoltage and with integrated follow current limitation, wherein a first surge arrester, in particular a spark gap or a varistor, is provided between network-side input terminals and a second surge arrester, in particular a varistor, is provided between load-side output terminals for follow current limitation according to claim 1.

It is known that overvoltage protection devices substantially contribute to the functional maintenance of electric systems and electronic installations.

By now, the use of overvoltage protection devices for protecting electric systems is part of the standard.

Since overvoltages of atmospheric origin, that is lightning overvoltages in principle occur against the ground potential of an electric system, the overvoltage protection of a low-voltage consumer installation needs to be provided between active conductors and the local ground potential. Depending on the respective network system of the low-voltage consumer installation, the number of necessary protection paths and the connection of the arresters will be designed. Standard arresters hence have the task to limit fast and briefly occurring overvoltages. These overvoltages, also called lightning and switching overvoltages due to their generation, fall within the terminology of "transient overvoltages". Temporally limited voltage increases at network frequency, however, are designated temporary overvoltage or TOV. Such temporary overvoltages can only be limited in a conditional manner due to their relatively long duration of time and constitute in this respect a very high stress for the arresters. The cause for TOV may be most different fault conditions within and outside the low-voltage supply installation.

From the aforementioned, it is therefor a task of the invention to propose a circuit arrangement for combined protection of a load from temporary and transient overvoltages which furthermore also enables an emergency operation of the load in the presence of temporary overvoltages.

The solution of the task of the invention is performed by a circuit arrangement according to the feature combination as per claim 1, the dependent claims constituting at least appropriate configurations and further developments.

Accordingly, a circuit arrangement for combined protection of a load from temporary and transient overvoltages with emergency operation of the load is taken as a basis, which refers to controlled semiconductor-based series and parallel elements. Due to capacitances inserted in the series and parallel branch, there is the possibility of guaranteeing emergency operation at a constant power, which allows, for example, the operation of power supplies of safety-relevant controls in the event of temporary overvoltages. Instead of using capacitances as series and parallel elements, there is basically the possibility of using ohmic or inductive voltage pre-dividers. The principle according to the invention, which is based on controlled series and parallel impedances, remains unaffected by this.

According to the invention, a controlled semiconductor switch is inserted in a first embodiment of the invention in the series branch between input and output terminals. A further controlled semiconductor switch is situated in the output-side parallel branch.

In a preferred embodiment, the semiconductor switch in the series branch has a mechanical switch connected in parallel, for example, realized as a relay, as well as a series capacitance connected in parallel.

The semiconductor switch in the parallel branch is part of a series circuit. This series circuit comprises a parallel circuit of a second surge arrester, in particular a varistor and a parallel capacitance.

In order to compensate for the inertia of the mechanical switch and to ensure a protection of the semiconductor switch in the series branch, a series inductance is provided in the series branch between the input terminal and the parallel circuit comprising the series capacitance, the controlled semiconductor switch and the mechanical switch.

A microcontroller is responsible for the control of the semiconductor switches, wherein the microcontroller is connected to a current detector in the series branch.

In a further development of the invention, the microcontroller is connected to the input terminals for detecting overvoltage, so that the respective input voltage value can be detected and used for processing and maintaining a logic signal.

Furthermore, a device for zero crossing detection is provided in a further development, on the basis of which an in-phase connection of the respective semiconductor switches is possible.

Preferably, the control of the semiconductor switch in the series branch is performed in a galvanically separated manner, in particular via a pulse transformer.

The control of the semiconductor switch in the parallel branch is realized actively by means of a pulse transformer in the event of detected temporary overvoltage. In the event of transient overvoltages, the control of the semiconductor switch in the parallel branch is performed via TVS diodes, wherein passive control is given above a voltage which is higher than the TVS diode voltage.

In a further embodiment of the invention, the microcontroller is connected to the output terminal for output voltage detection so as to provide a logic signal corresponding to the respective load conditions.

On the basis of the values determined by the current detector, the additional connection of the already mentioned mechanical switch is performed for avoiding an overload of the semiconductor switch in the series branch.

The series and parallel capacitances form a capacitive voltage divider so as to be able to continue the operation of small loads coupled to the output terminals also in the case of temporary overvoltages.

If a mechanical switch is dispensed with, the result will be the advantage that its slow response time will have no negative effects upon the circuit arrangement. In this case, the mentioned series inductance may be omitted for decoupling. A maximum voltage value at the load may be set via the switching level of the semiconductor switch in the series branch.

In order to limit the power loss of the semiconductor switches in the event of larger currents which are caused by the load, a parallel connection of a plurality of series semiconductors must be realized.

The invention will be explained in more detail below on the basis of an exemplary embodiment and a FIGURE.

The FIGURE shows a principle circuit diagram of the arrangement according to the invention for combined protection of a load from temporary and transient overvoltages with the option of the emergency operation of the load in the presence of a temporary overvoltage together with an integrated follow current limitation.

As represented in the FIGURE, a first known surge arrester, in particular formed as a spark gap or a varistor, is located between the input terminals E. This quasi upstream first surge arrester takes the majority of occurring surge currents and is configured for the maximum TOV voltage to be expected. Surge currents of a smaller amplitude, however, are taken by the semiconductor switches $HL_{Quer}$ in the parallel branch, and namely so long until the semiconductor switches $HL_{Längs}$ in the series branch are switched off.

A series inductance L is situated in the series branch between the input terminals and the output terminals, as well as a parallel circuit comprising the series capacitance $C_{Längs}$, a mechanical switch S as well as the already mentioned semiconductor switches $HL_{Längs}$ in the form of, for example, two semiconductors connected in parallel. Due to the low power loss, a combination of a mechanical switch, MOSFET and IGBT is particularly advantageous here.

The parallel branch that can be recognized in the FIGURE at the output terminals comprises a series circuit of semiconductor switches $HL_{Quer}$ as well as a parallel circuit as an integral part of the series circuit with a second surge arrester formed as a varistor 2 for follow current limitation, as well as a parallel capacitance $C_{Quer}$.

A microcontroller µC serves for controlling the semiconductor switches in the series branch $HL_{Längs}$ as well as of the semiconductor switches in the parallel branch $HL_{Quer}$.

Furthermore, a current detector SD is present which leads to a corresponding input of the microcontroller.

Furthermore, the microcontroller has inputs serving the purpose of detecting input voltages as well as detecting output voltages.

When load currents exceeding a certain set point are detected, the mechanical switch S may be connected in addition in the continuous operation with the aid of the current detector SD in order to relieve the semiconductor switch $HL_{Längs}$.

In order to enable an in-phase connection, zero crossing detection is provided according to the invention. This prevents too high inrush currents which otherwise would damage the employed semiconductor switches or reduce the lifetime thereof.

The voltage detection at the input enables temporary but also transient voltages to be detected first and to be able to respond while referring to the microcontroller and its internal program. The control of the series semiconductors $HL_{Längs}$ is preferably performed via a pulse transformer arrangement, wherein switching times and the energy turnover can be reduced.

In the event of temporary overvoltages, the control of the semiconductor switches in the parallel branch $HL_{Quer}$ is performed actively via a pulse transformer, however, in the event of transient overvoltages, passively via the use of TVS diodes. The passive control in the parallel branch is active whenever the control via the pulse transformer is deactivated and a voltage higher than the TVS diode voltage is present. This is the case in transient overvoltage events and also at the beginning of a temporary overvoltage, for example, when a temporary overvoltage is coupled into the circuit arrangement until it is detected by the microcontroller.

Basically, the detection of transient overvoltage events is performed by means of the microcontroller, which, however, has a response time that can hardly be influenced. In this case, a very high current can flow through the semiconductor switch in the series direction.

Via a passive TOV voltage detection by means of a diode chain which serves the purpose of detecting input voltages, an immediate control of the semiconductor switch in the series branch $HL_{Längs}$ may be performed quasi while bypassing the microcontroller. A faster detection and switch-off of the semiconductor switch in the series branch $HL_{Längs}$ allow for significantly higher surge currents to be carried.

Since mechanical switches on the basis of a relay likewise have a limited response time, for example, of between 2 and 8 ms, a solution needs to be created to rapidly respond to transient overvoltage events. In this respect, the series inductance L, for example, L=20 µH, is used. This decoupling inductance limits the relay current so that damages are avoided and relieves the parallel semiconductor.

The use of capacitors according to the exemplary embodiment allows an emergency operation to be ensured at a constant power. In case of, for instance, $C_{Längs}$=5 µF, a 150 W load may be operated at the output even when a switch-off, i.e. a separation from the mains caused by TOV is performed.

In the event of temporary overvoltages originating from a loss of neutral conductors, the load conditions in the phases must be taken in consideration.

The circuit arrangement according the exemplary embodiment may in this respect also be realized to be three-phase or multi-phase. For an affective protection against transient overvoltages, switching times of the series switch $HL_{Längs}$ of below 500 ns are desirable.

The operating modes of the presented arrangement will be briefly summarized below.

During continuous operation at a load of, by way of example, <6 A and a voltage $U_{TOV}$>340 V, usually only the semiconductor switch in the series branch is active so as to be able to quickly respond to a potential interruption of neutral conductors.

At a load of >6 A and $U_{TOV}$>340 V, the semiconductor switch $HL_{Längs}$ and the mechanical switch S are activated simultaneously so as to reduce the power loss in the continuous operation. The switching dynamics of the mechanical switch S may be considered at about 340 V as being sufficient for the load protection. An additional connection is only performed in the voltage zero crossing. The switching of the mechanical switch S may be realized in a currentless manner by the parallel semiconductor switch $HL_{Längs}$, which increases the lifetime of the switch.

When a transient overvoltage occurs, the upstream surge arrester 1 takes the majority of the surge current. Surge currents of a smaller amplitude are taken by the semiconductor switch $HL_{Quer}$ in the parallel branch until a switch-off takes place. Here, the following two cases must be distinguished.

In the first case, only the semiconductor switch in the series branch is active. The series member may be closed rapidly, i.e. the surge arrester 1 takes the full surge current.

In the second case, the semiconductor switch in the series branch and the mechanical switch are active. The mechanical switch is too slow to respond to transient events. In this case, the mentioned inductive decoupling is required, which reduces the surge current in the semiconductors to a tolerable extent.

In the TOV operation, an interruption of neutral conductors may take place. $U_{TOV}$ is in this case <270 V and the load is >12 A. The semiconductor switches in the series branch and the mechanical switch remain active, i.e. the load can be continued to operate normally.

In case of $U_{TOV}$>270 V and $I_{Last}$<12 A, the series switch in the parallel path is deactivated when a fault occurs. Loads of up to 150 W, for example, may further be operated via the capacitive divider $C_{Längs}$ and $C_{Quer}$, so that the desired emergency operating feature for increasing operational safety is reached.

The mentioned current threshold of, for example, >12 V represents a regulating instrument by means of which the control of the parallel and series switches becomes possible. Alternatively, a regulation to only the voltage amplitude of substantially 270 V may also be performed without any load current flow.

In case of a short circuit L-N in the adjacent phase, only the semiconductor switch is active at a load $I_{Last}$<6 A and can therefor quickly respond to the fault event.

At a load of >6 A, the semiconductor switch and the mechanical switch in the series branch are active. The reaction time is predetermined by the mechanical switches. The voltage increases for about 2 ms, for example, to 1.33 times of a reference voltage. This short-term voltage excess represents a transient stress for loads of a level of up to 1.33 times the reference voltage and may be considered as being unproblematic. The mechanical switch is switched off in a currentless manner since the semiconductor switch in the series branch takes the full current.

In the case of a short circuit L-N in the phase of the circuit arrangement itself, the semiconductor switch and the mechanical switch are activated in common until the fault is remedied by an upstream fuse.

In the case of a combination of semiconductor switches and the mechanical switch in the series branch, the maximum voltage value at the load is $1.33 \times U_{REF}$ during temporary events. During transient events, the protection level at the load is set to about 650 V.

The invention claimed is:

1. A circuit arrangement for combined protection of a load from temporary and transient overvoltages with emergency operation of the load in the presence of a temporary overvoltage and with integrated follow current limitation, wherein a first surge arrester (1), in particular a spark gap or a varistor, is provided between network-side input terminals (E) and a second surge arrester (2), in particular a varistor, is provided between load-side output terminals (A) for follow current limitation, characterized in that a first controlled semiconductor switch (HLLängs) is provided in the series branch between the input terminal and the output terminal (E; A) and a second controlled semiconductor switch (HLQuer) is provided in an output-side parallel branch, wherein a mechanical switch (S) and a series capacitance (CLängs) are connected in parallel with the first controlled semiconductor switch (HLLängs) in the series branch, furthermore the second controlled semiconductor switch (HLQuer) in the parallel branch is part of a series circuit comprising a parallel circuit of the second surge arrester (2) and a parallel capacitance (CQuer), with a series inductance (L) in the series branch between the input terminal (E) and the parallel circuit of the series capacitance (CLängs), the first controlled semiconductor switch (HLLängs) and the mechanical switch (S), as well as with a microcontroller (μC) for controlling the first controlled semiconductor switch and the second controlled semiconductor switch, wherein the microcontroller (μC) is connected to a current detector (SD) in the series branch.

2. The circuit arrangement according to claim 1, characterized in that for overvoltage detection, the microcontroller (μC) is connected to the input terminals (E) so as to receive the respective input voltage value.

3. The circuit arrangement according to claim 1, characterized in that a device for detecting zero crossing is provided, on the basis of which an in-phase connection of the semiconductor switches may be performed.

4. The circuit arrangement according to claim 1, characterized in that the control of the first controlled semiconductor switch ($HL_{Längs}$) in the series branch is performed via a pulse transformer.

5. The circuit arrangement according to claim 1, characterized in that when a temporary overvoltage (TOV) is detected, the control of the second controlled semiconductor switch ($HL_{Quer}$) in the parallel branch is performed actively by means of a pulse transformer, and when transient overvoltages are detected, the control is performed passively via TOV diodes, wherein the passive control is given as from a voltage which is above the diode voltage.

6. The circuit arrangement according to claim 1, characterized in that for detecting the output voltage, the microcontroller (μC) is connected to the output terminal (A) so as to provide a logic signal corresponding to the respective load ratio.

7. The circuit arrangement according to claim 1, characterized in that on the basis of the values obtained by the current detector (SD), an additional connection of the mechanical switch (S) is performed for avoiding the first controlled semiconductor switch in the series branch ($HL_{Längs}$) to be overloaded.

8. The circuit arrangement according to claim 1, characterized in that the series and parallel capacitances ($C_{Längs}/C_{Quer}$) form a capacitive voltage divider so as to be able to continue the operation of small loads coupled to the output terminals (A) also in the case of temporary overvoltages (TOV).

* * * * *